(12) United States Patent
Maciejewski et al.

(10) Patent No.: US 6,692,998 B2
(45) Date of Patent: Feb. 17, 2004

(54) INTEGRATED HIGH QUALITY DIODE

(75) Inventors: Edward P. Maciejewski, Wappingers Falls, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/727,163

(22) Filed: Nov. 30, 2000

(65) Prior Publication Data

US 2002/0063288 A1 May 30, 2002

(51) Int. Cl.[7] .................... H01L 21/00; H01L 21/84
(52) U.S. Cl. ............................. 438/155; 438/382
(58) Field of Search ........................ 438/525, 382, 438/155; 257/347, 350, 351

(56) References Cited

U.S. PATENT DOCUMENTS

| | | | | |
|---|---|---|---|---|
| 5,786,616 | A | * | 7/1998 | Fukumoto et al. ........... 257/358 |
| 6,100,153 | A | * | 8/2000 | Nowak et al. .............. 438/382 |
| 6,242,763 | B1 | * | 6/2001 | Chen et al. ................. 257/107 |
| 6,249,029 | B1 | * | 6/2001 | Bryant et al. ............... 257/351 |
| 6,255,694 | B1 | * | 7/2001 | Mandelman et al. ........ 257/350 |
| 6,291,325 | B1 | * | 9/2001 | Hsu .......................... 438/525 |
| 6,303,414 | B1 | * | 10/2001 | Ang et al. .................. 438/155 |
| 6,429,482 | B1 | * | 8/2002 | Culp et al. .................. 257/345 |

* cited by examiner

Primary Examiner—William David Coleman
(74) Attorney, Agent, or Firm—Daryl K. Neff

(57) ABSTRACT

A high-quality diode is formed in an SOI process, using standard steps and implant doses that are used in the process for other devices such as a FET and a buried resistor; in particular using a buried resistor mask and implant to form one side of the diode, using the FET gate oxide to terminate the P-N junction, and using the FET gate to protect the junction from shorting during the silicide step.

16 Claims, 4 Drawing Sheets

INTEGRATED HIGH QUALITY DIODE

FIELD OF THE INVENTION

The field of the invention is SOI integrated circuit processing to form an integrated circuit including field effect transistors (FETS) and diodes.

BACKGROUND OF THE INVENTION

Integrated circuits routinely use diodes according to the requirements of the circuit designer. In contemporary submicron FET processing, however, it is customary to employ "halo" or "pocket" implants in order to improve short-channel behavior of MOSFETs. This has the side effect of making P-N junctions that receive the halo implant leaky, so that they are not suited for use as band gap voltage regulators and for other requirements of analog circuits.

One could simply add process steps to form a high-quality diode, of course, but that would increase process complexity and therefore increase circuit cost.

It would be advantageous if a high-quality diode could be formed for analog applications that made use of process steps that were already present in a process.

SUMMARY OF THE INVENTION

The invention relates to a method of forming a high-quality diode in an SOI process, in which the steps of forming the diode are also used in forming other devices in the circuit, thus providing the diode without adding process complexity.

A feature of the invention is the use of an implant dose made available for the formation of buried precision resistors to form one side of the diode.

Another feature of the invention is the use of FET elements to form the active region of the P-N junction below the gate oxide and away from the source/drain edges used to contact the P-N diode.

Another embodiment of the invention is the use of a blocking insulator, normally used to form active resistor regions, to form and passivate the surface of a P-N diode junction and to block the diode from being shorted during the suicide step.

An advantageous feature of the invention is the use of the buried resistor implant, which is defined by photoresist, so that the P-N junction can be located at a preferred location, rather than using the source/drain implant, which is defined by a polysilicon layer and is not flexible in location.

DESCRIPTION OF THE PREFERRED EMBODIMENT

Figure 2:
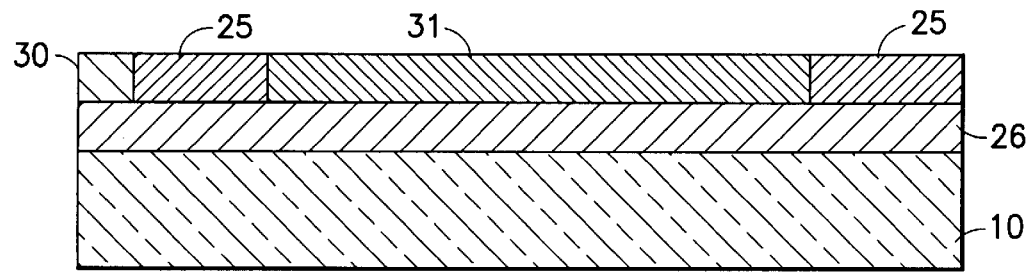
FIG. 2 shows in cross section the area of FIG. 1 after the step of forming shallow trench isolation.

Referring now to FIG. 2, there is shown a portion of a silicon on insulator (SOI) integrated circuit that will contain a diode according to the invention. Substrate 10 has a conventional layer of buried insulator (oxide) 26 above it and between p-type silicon device layer 30.

A pattern of shallow isolation trenches (STI) 25 has been formed to isolate the various devices from one another. Most of the devices will be field effect transistors (FETs), illustratively both NFETs and PFETs. The area 31 between the STI areas 25, illustratively doped p-, is referred to as the active area in general and as the diode active area when it will contain a diode according to the invention. Illustratively, the dimension extending in the left-right direction in the drawing is the same for the diode and for the FETS, with the length perpendicular to the paper extending as required in order to provide the desired current capacity. The process of forming the STI pattern—etching the trenches, filling them with oxide and chemical-mechanical polishing to remove excess oxide and define a common top surface is conventional, well known to those skilled in the art.

Figure 3:
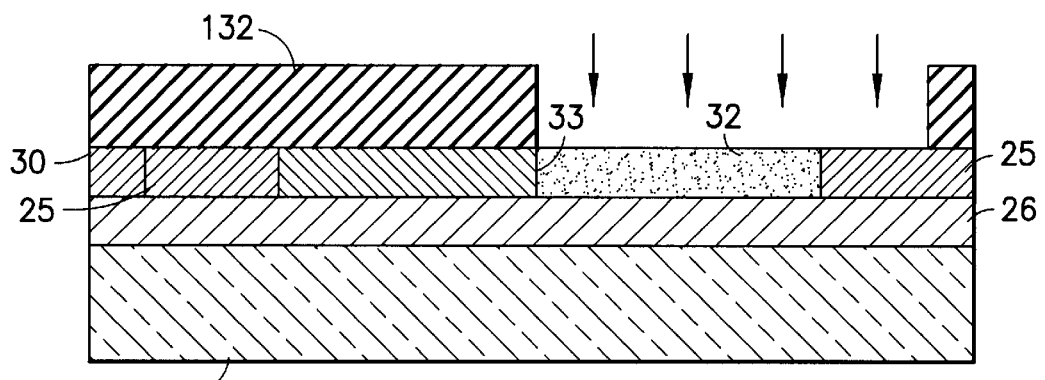
FIG. 3 shows in cross section the same area after the implantation of the buried resistor dose.

Next, in FIG. 3, a layer of resist 132 has been formed and patterned to define a set of apertures, not shown, that will receive a buried resistor implant, illustratively $2 \times 10^{15}/cm^2$ of phosphorous at 50 keV. The same dose is implanted in the aperture shown, doping the exposed silicon from its initial doping density of $5 \times 10^{15}/cm^3$ to a concentration suitable for diode operation and forming the N-doped section of the diode 32. The magnitude of the dose is not important—one of the advantageous features of the invention being that it provides two functions from several steps, thus saving on process complexity and cost. At the left of the aperture P-N junction 33 is the P-N junction of the diode. It is another advantageous feature of the invention that junction 33 is defined by resist, rather than by the polysilicon of the transistor gate, as is the case for the source/drain implants. The simultaneous use of the resistor-defining resist not only reduces cost, it also permits flexibility in locating the junction. Note that the aperture extends over STI area 25, providing tolerance in the aperture location. The diode aperture will be referred to in the claims as extending from the first edge of the STI to the diode junction.

Figure 4:
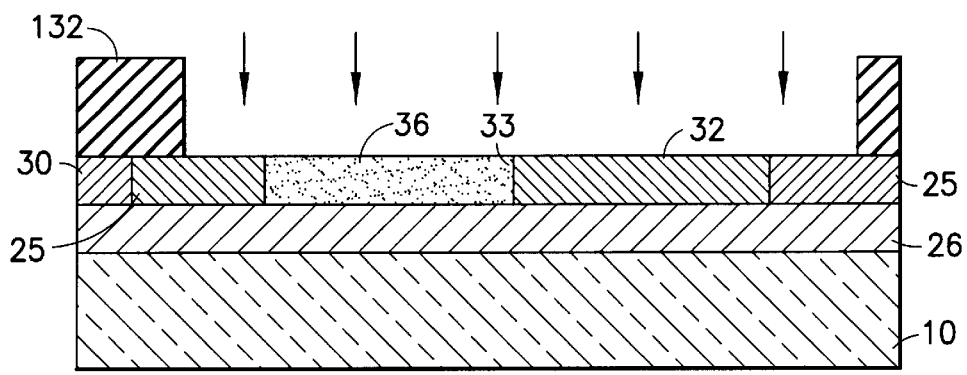
FIG. 4 shows in cross section the same area after the implantation of the optional p-well.

Next, in FIG. 4, there is shown an optional step of implanting a dose of p-type ions in a corresponding aperture over the P-N diode. The aperture extends from one STI 25 to the other for ease in alignment. Since this dose is less by three orders of magnitude than the dose in FIG. 3, it has no significant effect on element 32. The dose is referred to as optional in the event that the initial doping level of the device layer (or in a well in the device layer) is satisfactory. This dose also serves two functions. In the remainder of the circuit, it is the NFET threshold adjust, illustratively $2 \times 10^{12}/cm^2$ of $BF_2$ at 25 keV and $4 \times 10^{12}/cm^2$ boron at 50 keV. The p-type region is denoted by the numeral 36 and the right aperture edge in the figure is denoted by the numeral 33'.

Figure 5:
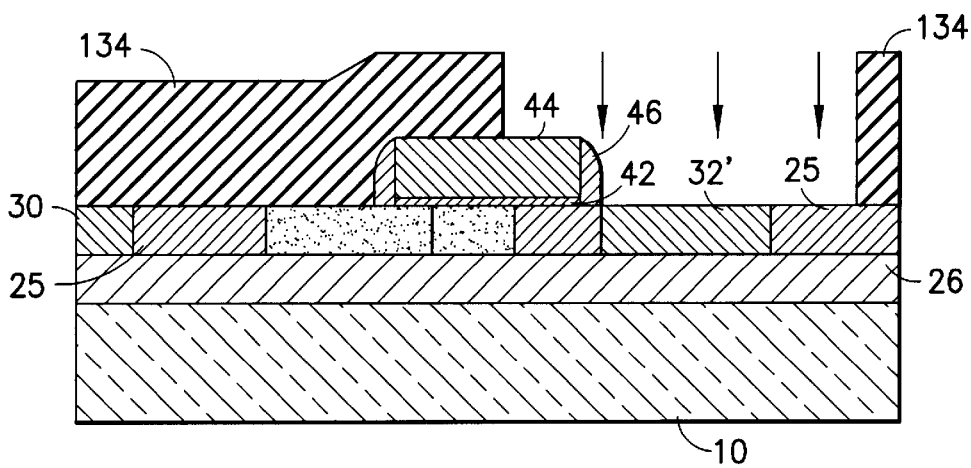
FIG. 5 shows in cross section the same area after the optional implantation of the N-type source/drain dose.
Figure 6:
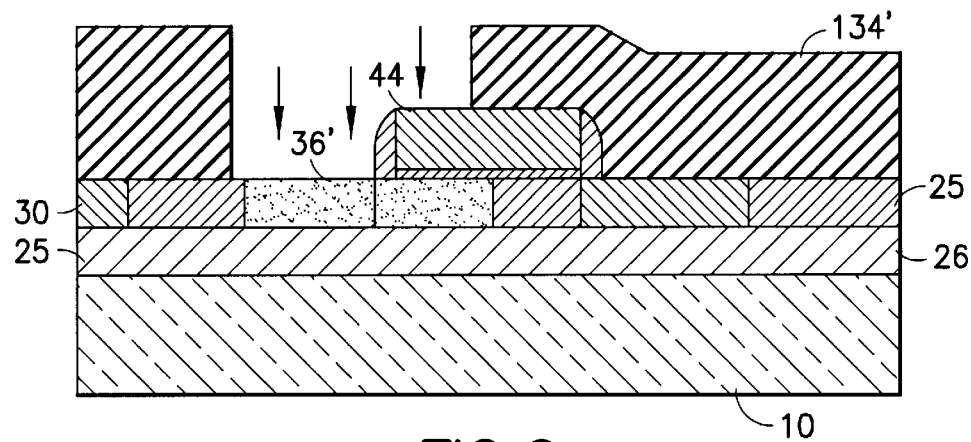
FIG. 6 shows in cross section the same area after the implantation of the P-type source/drain dose.

Referring now to FIG. 5, there is shown the results of further steps. Gate oxide 42, gate 44 and gate sidewalls 46 have all been formed simultaneously with the corresponding steps in FET formation. Gate oxide 42 in this case serves as a high-quality, passivated surface for the diode junction. Gate 44 will serve to protect the diode junction during the conventional later step of forming suicide to provide better contacts to the transistors. The optional step being illustrated in FIG. 5 is that of the NFET source/drain implantation defined by resist 134, which provides an ohmic contact 32' for the diode. This implantation is used in the event that the resistor implantation shown in FIG. 3 is not sufficient to provide for good electrical contact to the silicide to be formed over the cathode. Only one side of the diode is exposed for the implant in this aperture. A corresponding aperture and implant will be formed to provide an ohmic contact 36 on the p-type side as shown in FIG. 6. This implant is the same implant used in the p-type FET sources and drains, typically $5 \times 10^{15}/cm^2$ $BF_2$ at 15 keV.

It is an advantageous feature of the invention that the P-N diode can be centered under the gate stack and thus separated by a non-zero offset distance from the edge of the gate stack, so that it is better shielded by the gate stack than if the P-N junction were at one edge or the other of the gate stack. This advantage is realized because the P-N junction is defined by a resist aperture (FIG. 3), so that it can be located in the middle of the gate stack.

Figure 1:
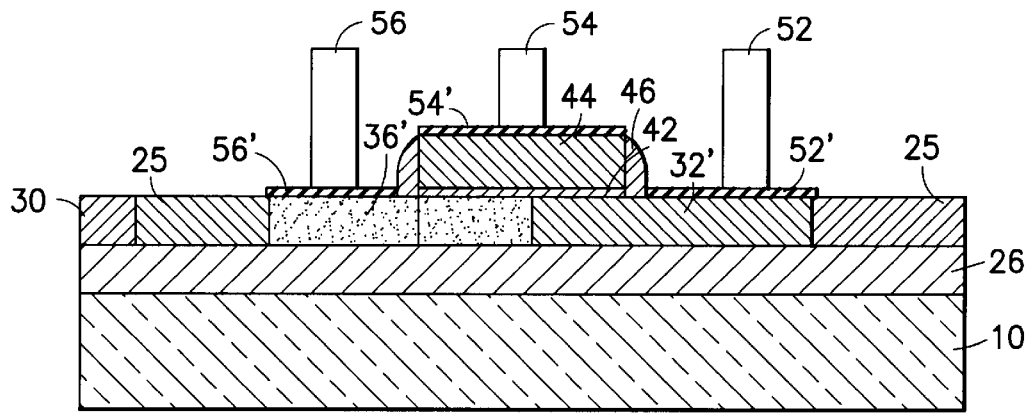
FIG. 1 shows in cross section a completed diode according to the invention.

Referring now to FIG. 1, there is shown the completed diode. The exposed silicon areas have been silicided and contacts 52, 54 and 56 have been formed making contact with suicides 52', 54' and 56'. Contact 52 will be conventionally tied to ground, but may lead elsewhere, depending on the circuit. Contact 54 will be tied to ground to prevent the lightly doped silicon of areas 32 and 36 from being inverted if stray charge on diode cover 44 sets up a strong enough field.

Figure 7:
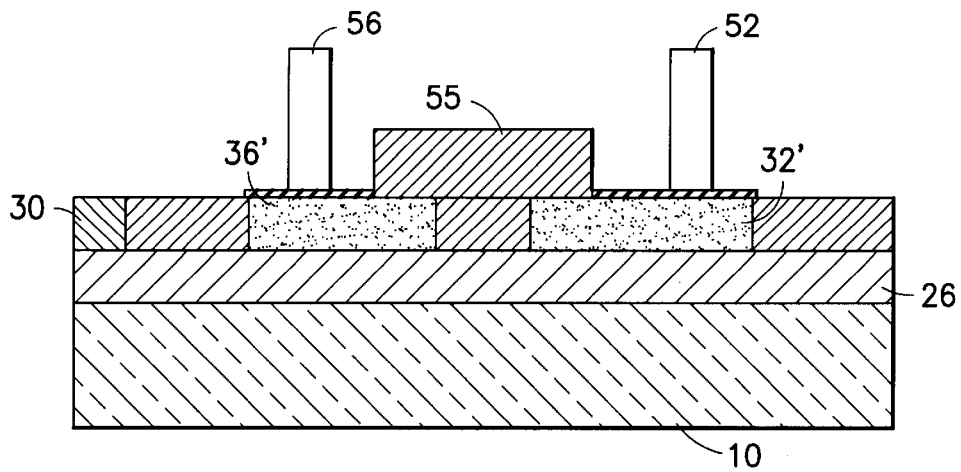
FIG. 7 shows the result of an alternative embodiment.
Figure 8:
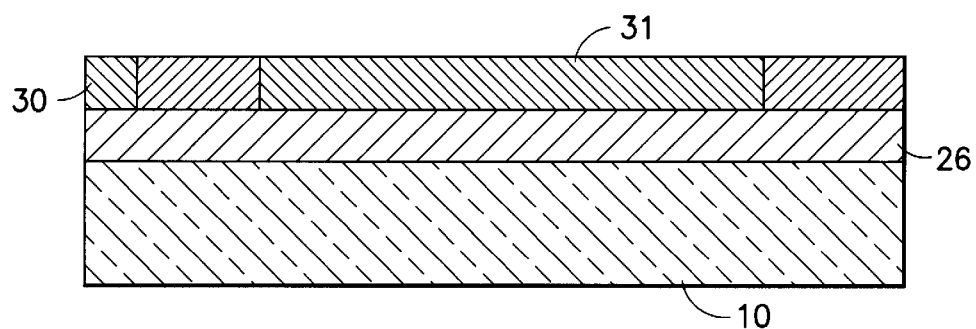
FIG. 8 shows the formation of a shallow trench for isolation.
Figure 9:
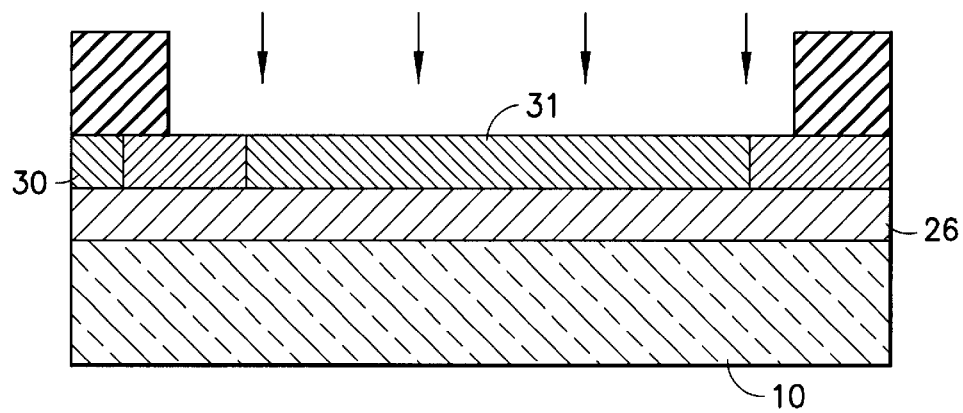
FIG. 9 shows the use of the P-well implant to dope the active area of the diode.
Figure 10:
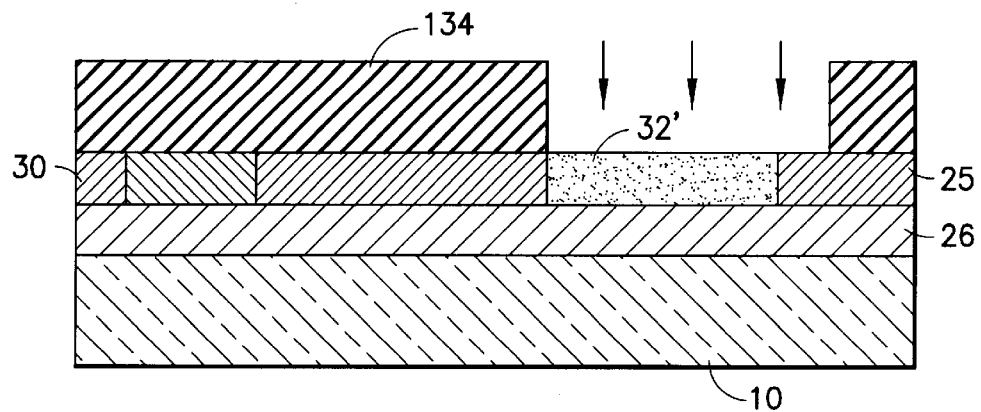
FIG. 10 shows implantation of the cathode of the diode.
Figure 11:
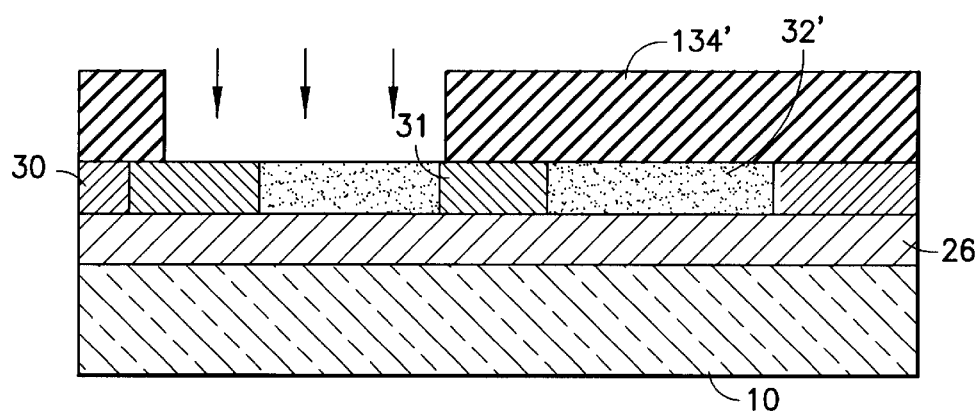
FIG. 11 shows the implantation of the $p^+$ area of the diode.
Figure 12:
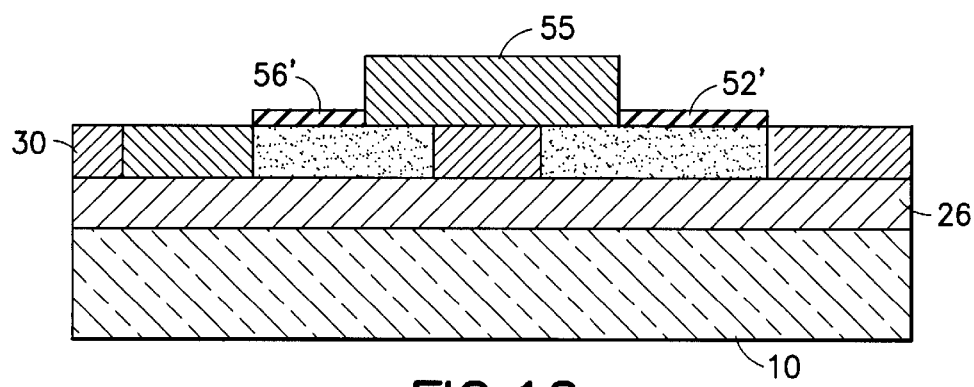
FIG. 12 shows the result of depositing a passivation layer.

FIG. 7 illustrates the result of an alternative process, similar components having the same numbers. This process uses an "OP" resistor process to form resistors, typically by covering source/drain implants with an insulator (e.g. silicon nitride). Referring now to FIG. 8, a pattern of STI 25 has been formed to isolate the diode region from other devices, similar to FIG. 2. Optionally, as shown in FIG. 9, the P-well implant may be used to dope the entire active area of the diode lightly p-type (as well as performing its primary function of doping the P-wells). Next, in FIG. 10, the resist used for source and drain NFET implants is opened above a portion of the diode region and the n+ implants form the cathode of the diode. As in FIG. 11, the region of the diode active area, displaced from the n+ doped region, is exposed and implanted p+ using the PFET source drain resist and implants. An insulator is deposited, silicon nitride being the preferred material, and patterned to leave the p-n junction region passivated as in FIG. 12. Preferably, this insulator is deposited simultaneously with the deposition of a resistor-defining layer that blocks silicidation of a selected area and therefore forms a buried resistor below that layer. A silicide is next formed selectively on exposed silicon regions, typically titanium or cobalt silicide.

The invention could be used to form a diode in an N-type layer, in an undoped layer, or in a bulk silicon wafer, with appropriate changes in the implant species and dose.

While the invention has been described in terms of a single preferred embodiment, those skilled in the art will recognize that the invention can be practiced in various versions within the spirit and scope of the following claims.

We claim:

1. A method of forming a diode in an SOI integrated circuit comprising the steps of:
    forming an STI pattern in a device layer of an SOT wafer doped with a first polarity, thereby defining a set of active areas in said device layer for the formation of FETs and at least one diode active area in said device layer for the formation of at least one diode, said at least one diode active area being outside said set of active areas for the formation of FETs;
    forming and patterning a layer of resist to define a first diode aperture over said diode active area between a first edge of said STI and a diode junction location and a set of resistor apertures in a set of resistor locations in said device layer outside said set of active areas for the formation of FETs and also outside said at least one diode active area, for the formation of at least one resistor;
    simultaneously implanting a buried resistor dose of ions of a second polarity opposite said first polarity in said set of resistor apertures and in said at least one diode active area, thereby forming a set of buried resistors and a P-N junction in said diode active area; and
    after said step of implanting a buried resistor dose of ions, simultaneously growing gate oxide and forming FET gates in said active areas and in said diode active area, thereby forming gate oxide and a pate over said P-N junction in said diode active area.

2. A method according to claim 1, further including the step of:
    simultaneously implanting an $N^+$ source/drain implant in NFET sources and drains self-aligned to said FET gates and in an N-type region of said diode active area, thereby forming an N-type contact.

3. A method according to claim 2, further including the step of:
    simultaneously implanting a $P^+$ source/drain implant in PFET sources and drains self-aligned to said FET gates and in a P-type region of said diode active area, thereby forming said diode having N-type and P-type contacts on opposite sides of said P-N junction.

4. A method of forming a diode in an SOI integrated circuit comprising the steps of:
    forming an STI pattern in a device layer of an SOI wafer doped with a first polarity, thereby defining a set of active areas in said device layer for the formation of BETs and at least one diode active area in said device layer for the formation of at least one diode, said at least one diode active area being outside said set of active areas for the formation of BETs;
    forming and patterning a layer of resist to define a first diode aperture over said diode active area between a first edge of said STI and a diode junction location and a set of resistor apertures in a set of resistor locations in said device layer outside said set of active areas for the formation of FETs and also outside said at least one diode active area, for the formation of at least one resistor;
    simultaneously implanting a buried resistor dose of ions of a second polarity opposite said first polarity in said set of resistor apertures and in said at least one diode active area, thereby forming a set of buried resistors and a P-N junction in said diode active area;
    after said step of implanting a buried resistor dose of ions, simultaneously growing gate oxide and forming FET gates in said active areas and in said diode active area, thereby forming gate oxide and a gate over said P-N junction in said diode active area; and
    forming and patterning a layer of resist to define a second diode aperture over said diode active area between a second edge of said STI and said diode junction and a set of NEET apertures in a set of NEET active areas in said device layer; and
    simultaneously implanting a threshold adjustment dose of ions of said first polarity in a set of well apertures and in said second aperture.

5. A method according to claim 1, in which:
    said device layer is initially doped p-type and said buried resistor dose is n-type.

6. A method according to claim 2, in which:
    said device layer is initially doped n-type and said buried resistor dose is p-type.

7. A method of forming a diode in an SOT integrated circuit comprising the steps of:

forming an STI pattern in a device layer of an SOT wafer doped with a first polarity, thereby defining a set of active areas in said device layer for the formation of FETs and at least one diode active area in said device layer for the formation of at least one diode, said at least one diode active area being outside said set of active areas for the formation of FETs;

forming and patterning a layer of resist to define a first diode aperture over said diode active area between a first edge of said STI and a diode junction location and a set of resistor apertures in a set of resistor locations in said device layer outside said set of active areas for the formation of FETs and also outside said at least one diode active area, for the formation of at least one resistor;

simultaneously implanting a buried resistor dose of ions of a second polarity opposite said first polarity in said set of resistor apertures and in said at least one diode active area, thereby forming a set of buried resistors and a P-N junction in said diode active area; and after said step of implanting a buried resistor dose of ions, depositing an insulating layer on said substrate directly contacting said diode active area, patterning and etching said insulating layer to form a set of blocking resistor regions in said active areas and in said diode active area, thereby forming a blocking insulator layer over said P-N junction in said diode active area.

8. A method according to claim 7, further including the steps of:

simultaneously implanting an $N^+$ source/drain implant in NFET sources and drains and in an N-type region of said diode active area and;

simultaneously implanting a $p^+$ source/drain implant in PFET sources and drains and in a P-type region of said diode active area, thereby forming said diode having N-type and P-type contacts on opposite sides of said P-N junction).

9. A method of forming a diode in an SOT integrated circuit comprising the steps of:

forming an STI pattern in a device layer of an SOT wafer doped with a first polarity, thereby defining a set of active areas in said device layer for the formation of FETs and at least one diode active area in said device layer for the formation of at least one diode, said at least one diode active area being outside said set of active areas for the formation of FETs;

forming and patterning a layer of resist to define a first diode aperture over said diode active area between a first edge of said STI and a diode junction location and a set of resistor apertures in a set of resistor locations in said device layer outside said set of active areas for the formation of FETs and also outside said at least one diode active area, for the formation of at least one resistor;

simultaneously implanting a buried resistor dose of ions of a second polarity opposite said first polarity in said set of resistor apertures and in said at least one diode active area, thereby forming a set of buried resistors and a P-N junction in said diode active area; and after said step of implanting a buried resistor dose of ions, simultaneously growing gate oxide and forming FET gates in said active areas and in said diode active area, thereby forming gate oxide over said P-N junction in said diode active area.

10. A method according to claim 9, further including the step of:

simultaneously implanting an $N^+$ source/drain implant in NFET sources and drains and in an N-type region of said diode active area, thereby forming an N-type contact.

11. A method according to claim 10, further including the step of:

simultaneously implanting a $p^+$ source/drain implant in PEET sources and drains and in a P-type region of said diode active area, thereby forming said diode having N-type and P-type contacts on opposite sides of said P-N junction.

12. A method according to claim 9, comprising the further steps of:

forming and patterning a layer of resist to define a second diode aperture over said diode active area between a second edge of said STI and said diode junction and a set of NFET apertures in a set of NFET active areas in said device layer; and simultaneously implanting a threshold adjustment dose of ions of said first polarity in a set of well apertures and in said second aperture.

13. A method according to claim 9, in which:

said device layer is initially doped p-type and said buried resistor dose is n-type.

14. A method according to claim 10, in which:

said device layer is initially doped n-type and said buried resistor dose is p-type.

15. A method of forming a diode in an SOI integrated circuit comprising the steps of:

forming an STI pattern in a device layer of an SOT wafer doped with a first polarity, thereby defining a set of active areas in said device layer for the formation of FETs and at least one diode active area in said device layer for the formation of at least one diode, said at least one diode active area being outside said set of active areas for the formation of FETs;

forming and patterning a layer of resist to define a first diode aperture over said diode active area between a first edge of said STI and a diode junction location and a set of resistor apertures in a set of resistor locations in said device layer outside said set of active areas for the formation of FETs and also outside said at least one diode active area, for the formation of at least one resistor;

simultaneously implanting a buried resistor dose of ions of a second polarity opposite said first polarity in said set of resistor apertures and in said at least one diode active area, thereby forming a set of buried resistors and a P-N junction in said diode active area; and after said step of implanting a buried resistor dose of ions, depositing an insulating layer on said substrate directly contacting said diode active area, patterning and etching said insulating layer to form a set of blocking resistor regions in said active areas and in said diode active area, thereby forming a blocking insulator layer over said P-N junction in said diode active area.

16. A method according to claim 15, further including the steps of:

simultaneously implanting an $N^+$ source/drain implant in NFET sources and drains and in an N-type region of said diode active area and;

simultaneously implanting a $P^+$ source/drain implant in PFET sources and drains and in a P-type region of said diode active area, thereby forming said diode having N-type and P-type contacts on opposite sides of said P-N junction.

* * * * *